United States Patent
Lee et al.

(10) Patent No.: US 7,983,051 B2
(45) Date of Patent: Jul. 19, 2011

(54) DRAM MODULE WITH SOLID STATE DISK

(75) Inventors: Jiunn-Chung Lee, Taipei Hsien (TW); Chien-Chung Huang, Taipei Hsien (TW)

(73) Assignee: Apacer Technology Inc., Taipei (TW)

( * ) Notice: Subject to any disclaimer, the term of this patent is extended or adjusted under 35 U.S.C. 154(b) by 520 days.

(21) Appl. No.: 12/100,023

(22) Filed: Apr. 9, 2008

(65) Prior Publication Data

US 2009/0257184 A1    Oct. 15, 2009

(51) Int. Cl.
*H05K 1/00* (2006.01)
(52) U.S. Cl. ............... 361/736; 361/760; 365/185.11
(58) Field of Classification Search ............ 361/760, 361/736; 365/185.11
See application file for complete search history.

(56) References Cited

U.S. PATENT DOCUMENTS

| | | | |
|---|---|---|---|
| 5,867,448 A * | 2/1999 | Mann | 365/233.14 |
| 7,624,222 B2 * | 11/2009 | Nanda et al. | 710/316 |
| 2003/0090937 A1 * | 5/2003 | Chen | 365/185.08 |
| 2007/0139898 A1 * | 6/2007 | Yang | 361/760 |
| 2007/0165457 A1 * | 7/2007 | Kim | 365/185.11 |
| 2009/0168525 A1 * | 7/2009 | Olbrich et al. | 365/185.11 |
| 2009/0172257 A1 * | 7/2009 | Prins et al. | 711/103 |
| 2009/0172258 A1 * | 7/2009 | Olbrich et al. | 711/103 |
| 2009/0172259 A1 * | 7/2009 | Prins et al. | 711/103 |
| 2009/0172260 A1 * | 7/2009 | Olbrich et al. | 711/103 |
| 2009/0172261 A1 * | 7/2009 | Prins et al. | 711/103 |
| 2009/0172262 A1 * | 7/2009 | Olbrich et al. | 711/103 |
| 2009/0172263 A1 * | 7/2009 | Olbrich et al. | 711/103 |
| 2009/0172308 A1 * | 7/2009 | Prins et al. | 711/154 |
| 2009/0172499 A1 * | 7/2009 | Olbrich et al. | 714/773 |

FOREIGN PATENT DOCUMENTS

| | | |
|---|---|---|
| CN | 1869868 A | 11/2006 |
| EP | 0566306 A2 | 10/1993 |
| EP | 0935255 A2 | 11/1999 |
| TW | 555077 | 9/2003 |
| TW | I249101 | 2/2006 |
| TW | M265290 | 8/2006 |

* cited by examiner

*Primary Examiner* — Dameon E Levi
(74) *Attorney, Agent, or Firm* — Chun-Ming Shih; HDLS IPR Services

(57) ABSTRACT

A dynamic radon access memory (DRAM) module includes a printed circuit board, a number of DRAM units, a number of flash memory units, a number connecting pins and an interface controller. The DRAM units and the flash memory units are distributed on the printed circuit board. The connecting pins are formed at an edge of the printed circuit board. The interface controller is electrically connected to the flash memory units and a portion of the connecting pins, wherein each of the interface controller provides at least one serial interface between the flash memory units and the portion of connecting pins thereby enabling data transmission through the portion of connecting pins in at least one serial mode. The flash memory units integrally constitute a flash disk drive in the DRAM module. Therefore, frequently installation and uninstallation of the flash memory drive can be avoided. A motherboard assembly including the aforementioned DRAM module can be developed.

3 Claims, 6 Drawing Sheets

| | 1 | 2 | 3 | 4 | 5 | 6 | 7 |
|---|---|---|---|---|---|---|---|
| USB | VCC | GND | D+ | D- | | | |
| SATA | GND | RXP | RXN | GND | TXN | TXP | GND |

FIG.2

DRAM MODULE WITH SOLID STATE DISK

BACKGROUND

The present invention relates to dynamic radon access memory (DRAM) modules, more particular, to a DRAM module with a solid state disk.

With the continuous development of solid state memory technology, flash memory devices such as flash memory cards and portable disks become widely used nonvolatile memory due to its excellent properties of high capacity, high access rate, low power consumption, miniaturization and high shock resistance. Especially, the capacity of flash memory comes into a unit of gigabytes in nowadays, it is believed that usage and development of flash memory can't be forecasted. For example, Microsoft has utilized flash memory to improve a response rate of its latest released operating system (OS) "Vista". In a so-called "ReadyBoost" technology in "Vista", a flash memory having USB interface is employed as an external memory device (EMD) to fetch up shortage of main system memory (generally DRAM). Furthermore, cache data can be stored in the flash memory such that a proportion of access operations of hard disk can be replaced by access operations of flash memory. Because an access rate of flash memory is higher than that of the hard disk, a performance of operating system is improved because an access rate of flash memory is higher than that of the hard disk. In addition, a so-called "ReadyDrive" hard disk, in which flash memory is used as a buffer for storing data when the operating system is in a sleep mode or shut up mode, also takes advantage of high access rate of flash memory to reduce a time period of waking up or starting up. Furthermore, the hard disk in the "ReadyDrive" hard disk can be shut up in a sleep mode; as a result, a power consumption of the "ReadyDrive" hard disk is thereby reduced, this is especially helpful to laptop computers that use battery as power supply.

It is to be understood that flash memory plays an important role in improving performance of a computer system according to above description. The flash memory may become a standard component of a computes system in future just like a DRAM module and a hard disk in nowadays. However, an additional flash memory driver having interface of USB is absolutely necessarily when a flash memory is communicating data with a computer, it is convenient to use such flash memory driver when the flash memory needs to be installed and uninstalled frequently, but when the flash memory become a standard component of a computers system the flash memory is rarely uninstalled. In such condition, the flash memory driver will cause an enclosure of a computer is lack of integrality. Furthermore, a transmission rate of USB interface is lower than that of SATA interface, but conventional flash memory disk can't use SATA interface to transmit data. It is believed a performance of Vista operation system will be improved if SATA interface can be applied in flash memory devices.

BRIEF SUMMARY

In one embodiment, a DRAM module includes a printed circuit board, a number of DRAM units, a number of flash memory units, a number connecting pins and an interface controller. The DRAM units and the flash memory units are distributed on the printed circuit board. The connecting pins are formed at an edge of the printed circuit board. The interface controller is electrically connected to the flash memory units and a portion of the connecting pins, wherein each of the interface controller provides at least one serial interface between the flash memory units and the portion of connecting pins thereby enabling data transmission through the portion of connecting pins in at least one serial mode.

BRIEF DESCRIPTION OF THE DRAWINGS

These and other features and advantages of the various embodiments disclosed herein will be better understood with respect to the following description and drawings, in which like numbers refer to like parts throughout, and in which:

FIG. 2 is schematic view showing pinout of USB interface and SATA interface;

DETAILED DESCRIPTION

FIG. 1 illustrates a front view and a rear view of a dynamic random access memory (DRAM) module 1 in accordance with a first embodiment. The DRAM module 1 is a substantially standard DRAM according with the DRAM module standard published by Joint Electron Device Engineering Council (JEDEC). Different specifications of DRAM modules include synchronous dynamic random access memory (SDRAM), double date rate synchronous dynamic random access memory (DDR SDRAM), double date rate two synchronous dynamic random access memory DDR SDRAM (DDR2 SDRAM), double date rate three synchronous dynamic random access memory DDR SDRAM (DDR3 SDRAM) and small outline dual in-line memory modules (SO-DIMM). In the first embodiment, the DRAM module 1 is a DDR2 SDRAM, however, it is understood that any one skill in the art can easily apply the present invention into other DRAM module such as SDRAM, DDR SDRAM, DDR3 SDRAM and SO-DIMM.

Figure 1A:
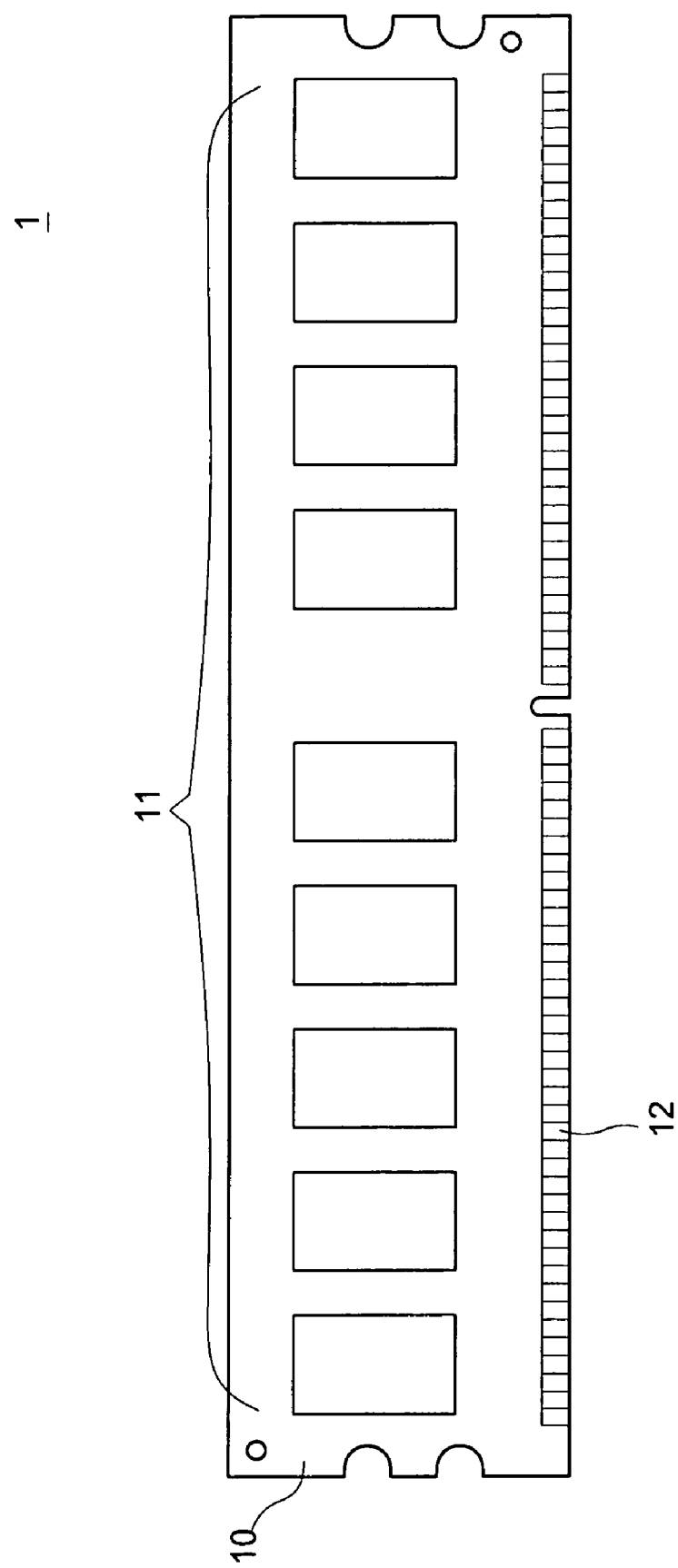
FIG. 1A is a front view showing a DRAM module in accordance with a first embodiment.
Figure 1B:
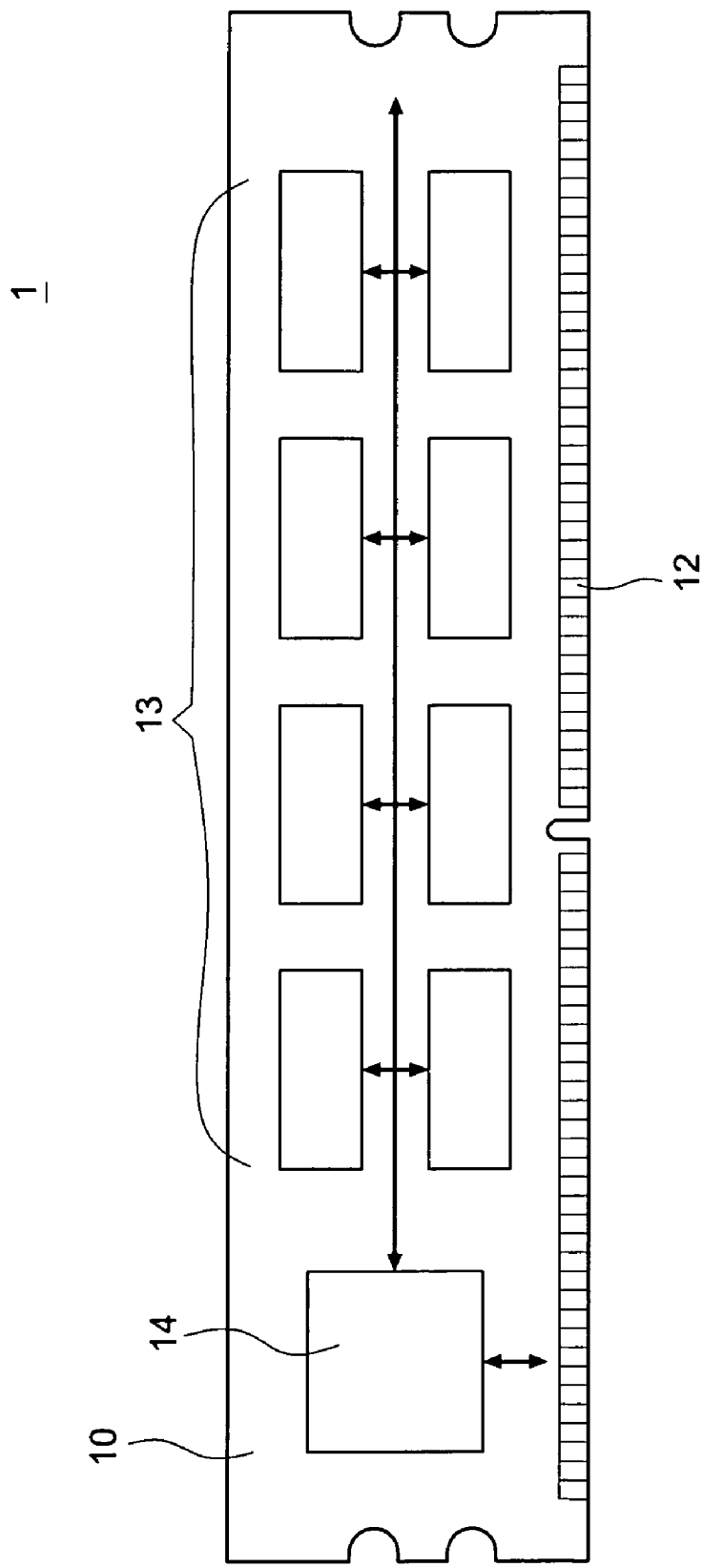
FIG. 1B is a rear view of the DRAM module of FIG. 1.

Referring to FIG. 1A, the DRAM module 1 includes a printed circuit board (PCB) 10 having a standard shape according to DRAM module standard and a number of DRAM units 11 distributed on a front surface of the PCB 10. A number of connecting pins 12, for example, golden fingers, are formed at an edge of the PCB 10. Mechanical and electrical specification of the connecting pins 12 are designed according to the DRAM module standard. As illustrated in FIG. 1B, a number of flash memory units 13 and an interface controller 14 are distributed on a rear surface of the PCB 10. The interface controller 14 is electrically coupled, for example, electrically connected, to the flash memory units 13 thereby controlling an access operation of flash memory units 13. The interface controller 14 is capable of converting input and output signals of the flash memory units 13 into universal serial bus (USB) mode, serial advanced technology attachment (SATA) mode or combination of USB mode and SATA mode. If the interface controller 14 works in a combination mode, the interface controller 14 can have a default mode, for example SATA mode, which has higher priority.

The flash memory units 13 and the interface controller 14 are connected to a computer system through not-connected (NC) pins thereby constituting a flash memory drive. FIG. 2 illustrates pinout of USB interface and SATA interface. USB interface needs 4 pins and SATA interface needs 7 pins. USB interface and SATA interface can directly use public GND pin in the connecting pins 12; therefore, only pins VCC, D+, D− in USB interface and pins RXP, RXN, TXN and TXP in SATA interface are absolutely necessary. In addition, SATA interface needs a power supply pin P. In sum, three NC pins are needed for providing USB interface in the DRAM module 1; five NC pins are needed for providing SATA interface in the DRAM module 1; and eight NC pins are needed for providing USB interface and SATA interface simultaneously in the DRAM module 1.

Distributions of NC pins in DRAM modules of different specifications are different. For example, 15 pins numbered 19, 126, 55, 156, 165, 171, 173, 174, 68, 76, 203, 102, 212, 224, 233 in a 240-pin DDR2 DRAM module are NC pins; 7 pins numbered 9, 100~103, 51 and 144 are NC pins in a 184-pin DDR DRAM module; 16 pins numbered 24, 25, 31, 44, 48, 50~51, 61~62, 108~109, 134~135 and 145~147 are NC pins in a 168-pin SDRAM module; 4 pins numbered pins 50, 69, 120 and 163 are NC pins in a 200-pin DDR2 SDRAM SO-DIMM module; and 8 pins numbered 57-60 and 77-80 are NC pins in a 144-pin SDRAM SO-DIMM module are NC pins. That is to say, USB interface can be provided in all the DRAM module described above; SATA interface can be provided in the 240-pin DDR2 DRAM module, the 184-pin DDR DRAM module, the 168-pin SDRAM module, and the 144-pin SDRAM SO-DIMM module; and USB interface and SATA interface can be provided simultaneously in the 240-pin DDR2 DRAM module, the 168-pin SDRAM module and the 144-pin SDRAM SO-DIMM module.

Figure 3:
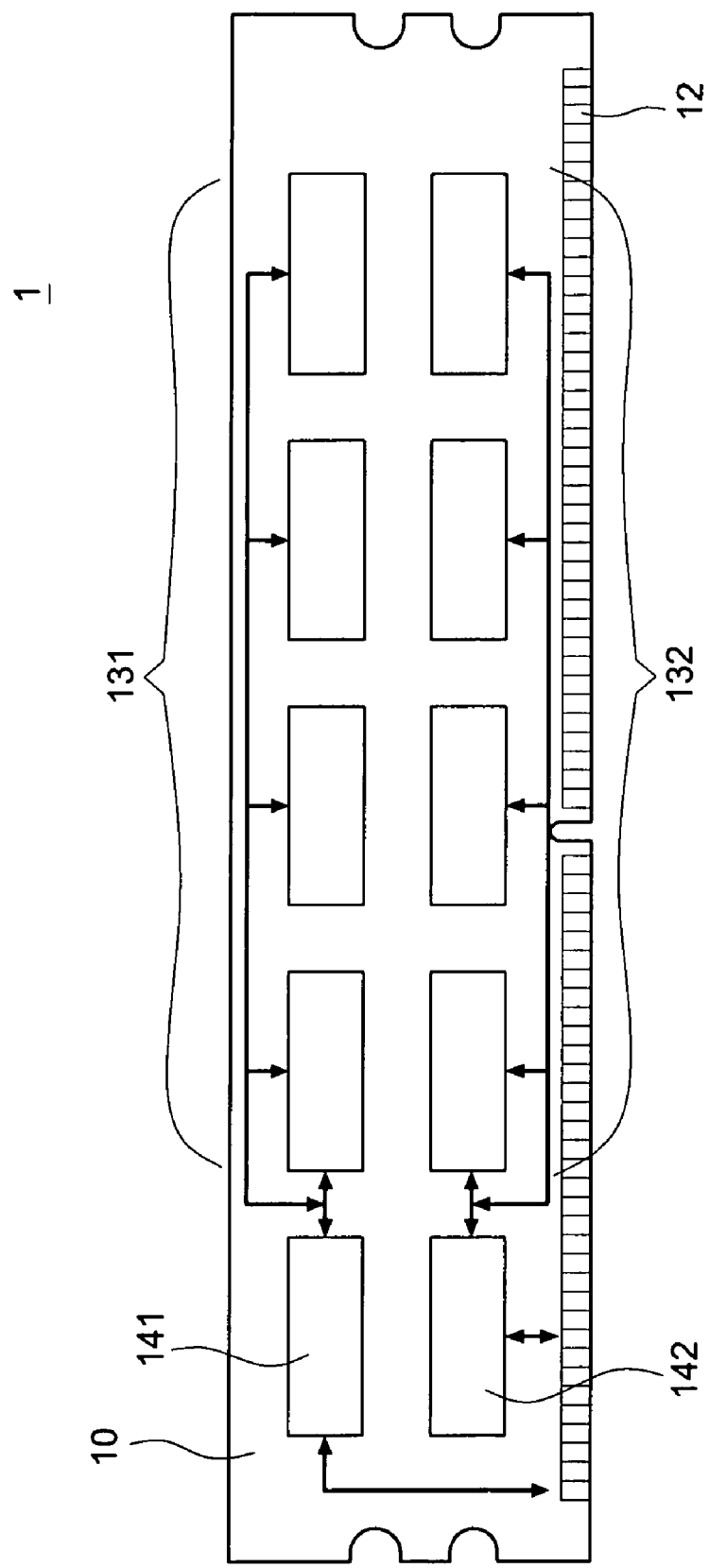
FIG. 3 is a schematic view showing a DRAM module in accordance with a second embodiment.

The flash memory units 13 and interface controller 14 constitute a flash memory drive. The interface of the flash memory drive is controlled by a user. The user can directly use the default interface, for example SATA interface, of the flash memory drive or change the interface of the flash memory drive to a desired mode. Furthermore, two separated flash memory drive having respective interface can also be provided in one DRAM module. For example, referring to FIG. 3, a DRAM module 1 in accordance with a second embodiment includes a printed circuit board 10', and a number of first flash memory units 131, a number of second flash memory units 132, a first interface controller 141, second interface controller 142 distributed on the printed circuit board 20.

The first flash memory units 131 are electrically coupled to the first interface controller 141. The first interface controller 141 is electrically connected to the connecting pins 12. The second flash memory units 131 are electrically coupled to the second interface controller 141. The second interface controller 141 is electrically connected to the connecting pins 12. The first flash memory units 131 and the first interface controller 141 constitute a first flash memory drive. The second flash memory units 132 and the second interface controller 142 constitute a second flash memory drive. The first interface controller 141 and the second interface controller 142 are configured for providing interface between the first flash memory drive, the second flash memory drive and a computer system respectively. In other words, the first flash memory drive and the second flash memory drive are separated with each other. The first interface controller 141 can be set to a USB mode while the second interface controller 142 can be set to a SATA mode. As described above, adequate NC pins must be available in the DRAM module 1. Three NC pins are needed for USB interface for one separated flash memory drive, and five NC pins are needed for SATA interface for one separated flash memory drive.

Figure 4:
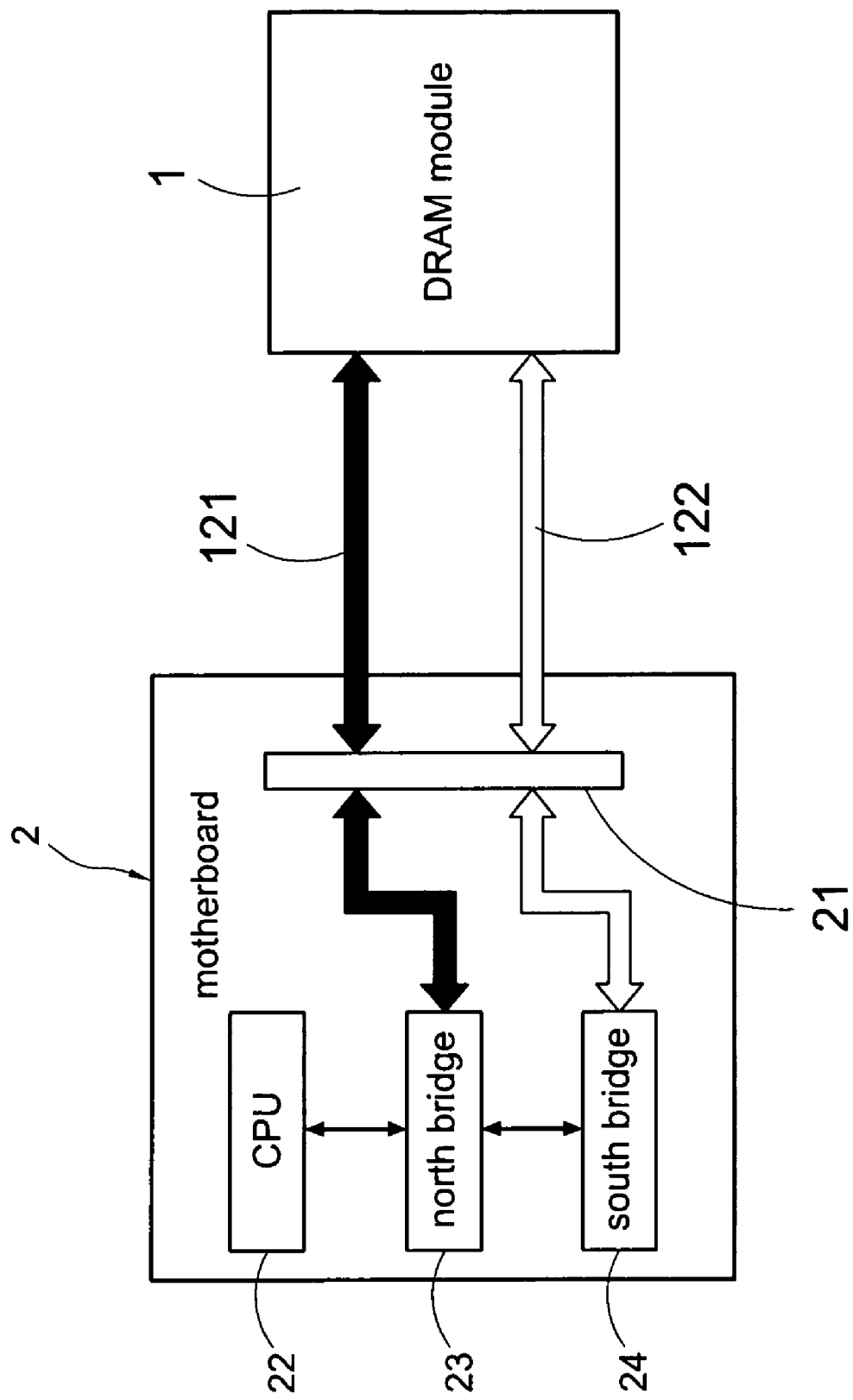
FIG. 4 is a schematic view showing the DRAM module of FIG. 1 is connected to a motherboard.

FIG. 4 illustrates motherboard assembly, in which the DRAM module 1 of the first embodiment is electrically connected to a motherboard 2. The motherboard 4 includes a slot 21, a CPU 22, a north bridge 23, and a south bridge 24. The electrical connection of the slot 21 is changed according to the NC pins that are used in the DRAM module 1. Specifically, DRAM signals 121 from effective pins in DRAM module 1 are introduced into the north bridge 23 just as a standard DRAM module, but flash memory drive signals 122 from the NC pins electrically connected to the interface controller 14 of DRAM module 1 are introduced into the south bridge 24. The DRAM units 11 in the DRAM module 1 serve as main memory while the flash memory units 13 and the interface controller 14 in the DRAM module 1 serve as a flash memory drive. The flash memory drive is installed when the DRAM module 1 is installed in the slot 21; therefore frequently installation and uninstallation of the flash memory drive can be avoided. Furthermore, the DRAM units 11 and flash memory drive run independently. Usage of the flash memory doesn't effect the DRAM units' 11 operation. In addition, it is known in the art that the CPU 22 is coupled to the PCB 20 using a CPU socket.

Figure 5:
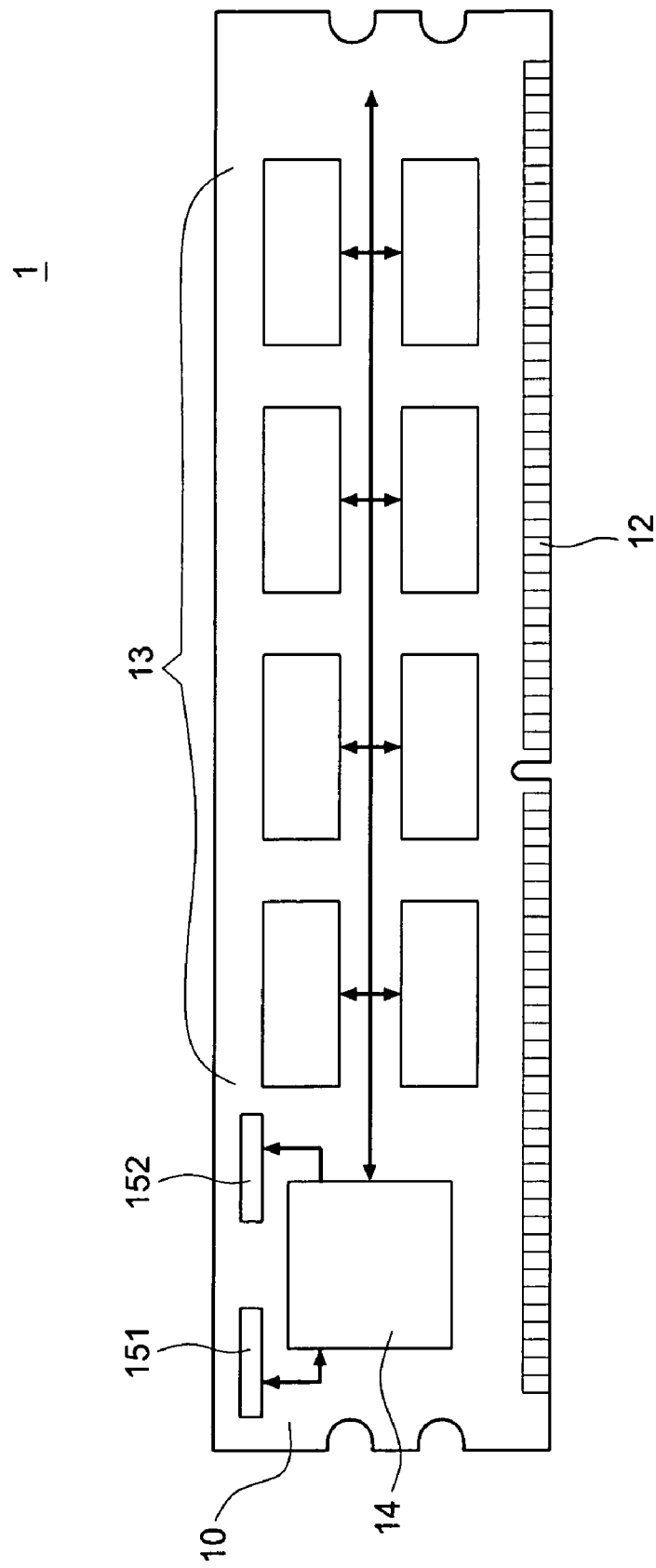
FIG. 5 is a schematic view showing a DRAM module in accordance with a third embodiment.

FIG. 5 illustrates a DRAM module 1 in accordance with a third embodiment, in which an interface controller 14 is electrically connected to a USB connector 151 and a SATA connector 152. Furthermore, the interface controller 14 is electrically isolated from the connecting pins 12. The USB connector 151 is used for USB interface and the SATA connector 152 is used for SATA interface. Two flexible flat cables can be used to electrically connect the USB connector 151 and the SATA connector to USB slot and SATA slot in a motherboard respectively. However, it is known that the DRAM module may only include one of the USB connector 151 and the SATA connector 152. In such circumstance, only one of the USB interface and SATA interface can be provided in the DRAM module 1. The DRAM module 1 is compatible with any motherboard that is compatible with standard DRAM module without changing the design of the motherboard.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A motherboard assembly, comprising:
   a motherboard comprising a memory slot, and a south bridge;
   a dynamic random access memory (DRAM) module received in the memory slot, wherein the DRAM module serving as memory on the motherboard comprises a printed circuit board, a plurality of flash memory units distributed on the printed circuit board, and at least one interface controller electrically connected to the flash memory units, the at least one interface controller is electrically connected to the south bridge, and the flash memory units serve as a solid state disk on the motherboard.

2. The motherboard assembly as claimed in claim 1, wherein the DRAM module comprises a plurality of non-connected pins, the at least one interface controller is electrically connected to non-connected pins, and the non-connected pins are electrically connected to the south bridge.

3. The motherboard assembly as claimed in claim 1, further comprising at least one connector mounted on the printed circuit board, the at least one interface controller is electrically connected to the at least one connector, and the at least one connector is configured for electrically connecting the interface controller to the south bridge.

* * * * *